(12) United States Patent
Prindle et al.

(10) Patent No.: US 8,748,302 B2
(45) Date of Patent: Jun. 10, 2014

(54) REPLACEMENT GATE APPROACH FOR HIGH-K METAL GATE STACKS BY USING A MULTI-LAYER CONTACT LEVEL

(75) Inventors: Christopher M. Prindle, Dresden (DE); Johannes F. Groschopf, Radebeul (DE); Andreas R. Ott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/400,981

(22) Filed: Feb. 21, 2012

(65) Prior Publication Data

US 2013/0214335 A1  Aug. 22, 2013

(51) Int. Cl.
*H01L 21/3205* (2006.01)

(52) U.S. Cl.
USPC ........... 438/585; 438/587; 438/692; 438/694; 257/E21.23

(58) Field of Classification Search
None
See application file for complete search history.

(56) References Cited

U.S. PATENT DOCUMENTS

| 6,693,038 B1 * | 2/2004 | Shen .......................... 438/700 |
| 2005/0136677 A1 * | 6/2005 | Brask et al. .................. 438/706 |
| 2010/0112798 A1 * | 5/2010 | Lai et al. ...................... 438/591 |
| 2010/0330808 A1 * | 12/2010 | Richter et al. ................ 438/691 |
| 2011/0269381 A1 | 11/2011 | Groschopf et al. ............. 451/54 |

FOREIGN PATENT DOCUMENTS

DE    102010028461 A1    11/2011    ............ H01L 21/304

OTHER PUBLICATIONS

Richard C. Jaeger, Introduction to Microelectronic Fabrication, 2nd edition. 6.3 p. 136. Prentice Hall 2002.*
Translation of Official Communication from German Patent Office for German Patent Application No. 10 2012 205 298.4 dated Jan. 5, 2013.

* cited by examiner

*Primary Examiner* — Marcos D. Pizarro
*Assistant Examiner* — Cesar Lopez
(74) *Attorney, Agent, or Firm* — Amerson Law Firm, PLLC

(57) ABSTRACT

In a replacement gate approach, the dielectric material for laterally encapsulating the gate electrode structures may be provided in the form of a first interlayer dielectric material having superior gap filling capabilities and a second interlayer dielectric material that provides high etch resistivity and robustness during a planarization process. In this manner, undue material erosion upon replacing the placeholder material may be avoided, which results in reduced yield loss and superior device uniformity.

9 Claims, 4 Drawing Sheets

REPLACEMENT GATE APPROACH FOR HIGH-K METAL GATE STACKS BY USING A MULTI-LAYER CONTACT LEVEL

BACKGROUND OF THE INVENTION

1. Field of the Invention

Generally, the present disclosure relates to sophisticated integrated circuits including transistor elements comprising gate structures formed on the basis of a high-k gate dielectric material and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped regions, referred to as drain and source regions, with a slightly doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, the conductivity of the channel region substantially affects the performance of MOS transistors. Thus, the scaling of the channel length, and associated therewith the reduction of channel resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice in the near future for circuits designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of the gate insulation layer that separates the gate electrode, frequently comprised of polysilicon or metal-containing materials, from the silicon channel region. In steadily improving device performance of field effect transistors, the length of the channel region has been continuously reduced to improve switching speed and drive current capability. Since the transistor performance in terms of switching speed and drive current is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be ensured. It turns out that decreasing the channel length requires an increased capacitive coupling to avoid the so-called short channel behavior during transistor operation. The short channel behavior may lead to an increased leakage current and to a pronounced dependence of the threshold voltage on the channel dimension. Aggressively scaled transistor devices with a relatively low supply voltage and thus reduced threshold voltage may suffer from an exponential increase of the leakage current, while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 µm may require a gate dielectric made of silicon dioxide as thin as approximately 1.2 nm. Although generally usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range of 1-2 nm that may not be compatible with thermal design power requirements for performance driven circuits.

Therefore, replacing silicon dioxide-based dielectrics as the material for gate insulation layers has been considered, particularly for extremely thin silicon dioxide-based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide-based layer, while additionally maintaining leakage currents at an acceptable level. On the other hand, the non-polysilicon material, such as titanium nitride and the like, in combination with other metals, may be formed so as to connect to the gate dielectric, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures.

For this reason, in some approaches, the initial gate electrode stack may be provided with a high degree of compatibility with conventional polysilicon-based process strategies and the actual electrode metal, possibly in combination with a high-k dielectric material, and the final adjustment of the work function of the transistors may be accomplished in a very advanced manufacturing stage, i.e., after completing the basic transistor structure. In a corresponding replacement gate approach, a standard polysilicon or amorphous silicon material may be patterned on the basis of well-established advanced lithography and etch techniques. After patterning the gate electrode structure, conventional and well-established process techniques for forming the drain and source regions having the desired complex dopant profile are typically performed. After any high temperature processes, the further processing may be continued by the deposition of an interlayer dielectric material, such as silicon nitride in combination with silicon dioxide and the like.

In this manufacturing stage, a top surface of the gate electrode structures embedded in the interlayer dielectric material has to be exposed, which is accomplished by chemical mechanical polishing (CMP). The polysilicon material exposed during the CMP process is then removed and, thereafter, an appropriate masking regime may be applied in order to selectively fill in an appropriate metal for any type of transistors.

Although, in general, this approach may provide advantages in view of reducing process-related non-uniformities in the threshold voltages of the transistors, the complex process sequence for exposing and then removing the placeholder material and providing appropriate work function materials for the different types of transistors may also result in a significant degree of variability of the transistor characteristics, which may thus result in offsetting at least some of the advantages obtained by the common processing of the gate electrode structures until the basic transistor configuration is completed.

For example, an efficient removal of the polysilicon material may have a significant influence on the overall characteristics of the replacement gate, i.e., on the provision of appropriate work function metals for the N-channel transistor and P-channel transistor and the subsequent deposition of the actual metal-containing electrode material.

Typically, a dielectric cap material may be preserved throughout the entire processing of the semiconductor devices, which may be advantageous in terms of maintaining integrity of the gate electrode structure prior to replacing the polysilicon material. It turns out, however, that the exposure of the top surface of the polysilicon material may represent a very critical process phase during the replacement gate approach, in particular when a dielectric cap layer, for instance provided in the form of a silicon nitride material, is present on the polysilicon material, as will be explained in more detail with reference to FIGS. 1a-1b.

FIG. 1a schematically illustrates a cross-sectional view of a semiconductor device 100 in an advanced manufacturing stage. As illustrated, the device 100 comprises a substrate 101, above which is formed a semiconductor layer 102. The semiconductor layer 102 is typically provided in the form of any appropriate semiconductor material, such as silicon and the like, wherein, if a silicon-on-insulator (SOI) architecture is considered, a buried insulating material (not shown) is typically formed directly below the semiconductor layer 102. In other cases, the semiconductor layer 102 represents a portion of a crystalline semiconductor material of the substrate 101, if a bulk architecture is considered. The semiconductor layer 102 comprises a plurality of active regions, wherein, for convenience, a single active region 102a is illustrated in FIG. 1a. Generally, an active region is to be understood as a semiconductor region in and above which one or more transistors are formed. In the example shown in FIG. 1a, a plurality of transistors 150 are formed in and above the active region 102a and may represent transistors of the same conductivity type in a device region in which a plurality of densely packed transistors are required. The transistors 150 typically comprise gate electrode structures 160, the final configuration of which is still to be established on the basis of a replacement gate approach, as discussed above. The gate electrode structures 160 in this manufacturing stage comprise a dielectric material 161, such as a silicon dioxide material and the like, in combination with a polysilicon material 162, which is to be considered as a placeholder material since at least the material 162 is to be removed in a later manufacturing stage. Moreover, a sidewall spacer structure 164 is typically provided which, for instance, enables a desired lateral and vertical profiling of drain and source regions 151. Furthermore, as discussed above, frequently, a dielectric cap layer or cap layer system 163 is provided, which has been removed during the subsequent processing, while in other cases the cap layer 163 may be omitted. Furthermore, a contact level 120 comprising an interlayer dielectric material 121 is provided so as to laterally enclose the gate electrode structures 160. It should be appreciated that, in the manufacturing stage shown, a top surface of the polysilicon material 162 may be exposed, as is required for the subsequent replacement of the material 162 with at least a metal-containing electrode material.

The semiconductor device 100 as shown in FIG. 1a may be formed on the basis of the following processes. The active region 102a is formed on the basis of well-established process techniques, for instance forming isolation structures (not shown), thereby defining the lateral size, position and shape of any active regions in the semiconductor layer 102. Prior to or after forming the corresponding isolation structures, the basic doping characteristics may be adjusted, for instance by ion implantation in combination with appropriate masking regimes, as is well known in the art. Next, the gate electrode structures 160 are formed by depositing or otherwise forming the dielectric material 161, followed by the deposition of the placeholder material 162, for instance in the form of a polysilicon material. Typically, additional hard mask material and other sacrificial materials are to be provided in order to enable the patterning of the resulting layer stack on the basis of sophisticated lateral dimensions as are typically required in advanced semiconductor devices. For example, a critical dimension of the gate electrode structures 160 may be 50 nm and significantly less. For example, the resulting layer stack may also comprise the dielectric cap material 163, for instance in the form of silicon nitride and the like, which may be used as a hard mask material upon patterning the underlying material layers based on sophisticated lithography and etch techniques. Thereafter, a portion of the drain and source regions 151 may be formed, for instance by ion implantation, selective epitaxial growth techniques and the like, depending on the overall process strategy and the device requirements. It should be appreciated that additional processes may be implemented, for instance in order to incorporate strain-inducing semiconductor alloys (not shown) and the like. Moreover, the spacer structure 164 may be completed followed by further implantation processes, if required, in order to establish the final vertical and lateral dopant profile of the drain and source regions 151. This may also involve the application of anneal processes based on any appropriate process techniques. If required, additional metal silicide regions may be formed in the drain and source regions 151, which may also be accomplished on the basis of the sidewall spacer structure 164, wherein the dielectric cap layer 163, if still in place, may efficiently prevent silicidation of the placeholder material 162. In other cases, the formation of a metal silicide in the drain and source regions 151, or at least in a portion thereof, may be accomplished in a later manufacturing stage.

Next, the contact level 120 comprising the interlayer dielectric material 121 is formed, for instance by depositing the dielectric material 121 so as to attempt to substantially completely fill the spaces between the closely spaced gate electrode structures 160. As discussed above, in sophisticated semiconductor devices, the packing density is significantly increased by reducing the critical dimensions and thus also reducing the distance between neighboring circuit components, wherein, in particular, in densely packed device areas such as memory areas and the like, the resulting high aspect ratio created by the closely spaced gate electrode structures 160 may result in deposition-related irregularities, such as the formation of voids in the material 121 between the closely spaced gate electrode structures 160.

As is well known, particularly silicon dioxide is a well-established interlayer dielectric material which may be deposited on the basis of a plurality of deposition recipes, which may have significant differences with respect to their process results. For example, well-established silicon dioxide deposition recipes are available which provide a substantially flow-like deposition behavior, which results in a reliable filling of openings of even high aspect ratio, such as the spaces between the closely spaced gate electrode structures 160. Other deposition techniques for providing a silicon dioxide-like material with superior gap filling capabilities is the spin coating of a dielectric base material having a low viscous state, wherein subsequently a heat treatment may be performed so as to obtain a silicon dioxide-like material upon initiating a material modification and removing any solvents therefrom. It turns out, however, that the deposition techniques providing the superior gap filling capability result in the generation of a silicon dioxide-like material of inferior density and thus quality with respect to the further processing of the semiconductor device 100. That is, typically any such materials may have a reduced density and/or a significantly reduced etch resistivity with respect to a plurality of efficient wet chemical etch recipes, which are typically used for removing contaminants, etching silicon material and the like. Similarly, these deposition recipes providing the superior gap filling capabilities may also result in a material having a significantly reduced resistivity during well-established polishing processes, which are frequently used for removing an excess portion 121e of the interlayer dielectric material 121 in order to finally expose the placeholder material 162.

On the other hand, process techniques are available in which silicon dioxide-like materials with superior density and thus enhanced etch resistivity and mechanical strength may be provided, however, with a pronounced tendency of producing voids upon filling high aspect ratios, such as the spaces between the densely packed gate electrode structures 160. Since any such voids may result in significant device failures upon further processing of the semiconductor device 100, conventional process strategies rely on superior gap filling capabilities and attempt to cope with inferior etch resistivity and/or increased removal rate during a polishing process.

Thus, the material 121 may be provided in a substantially void-free manner on the basis of spin coating, flow-like CVD deposition techniques and the like. Thereafter, the excess material 121e is removed during a planarization process 103, which comprises one or more polishing steps, wherein, at least in a final phase, the dielectric cap layer 163 is to be removed and subsequently the surface of the polysilicon material 162 is exposed. As discussed above, due to the inferior mechanical characteristics of the material 121, however, the polishing rate may be increased, thereby creating recesses 121r laterally adjacent to the gate electrode structures 160, which may be particularly pronounced when the cap layer 163 has to be removed in a final phase of the planarization process 103, since typically it is extremely difficult to obtain a similar removal rate for silicon nitride and silicon dioxide-based materials.

FIG. 1b schematically illustrates the semiconductor device 100 in a further advanced manufacturing stage. As illustrated, the gate electrode structures 160 are now provided in the form of high-k metal gate electrode structures and comprise a high-k dielectric material 165 in combination with two or more metal-containing electrode materials 166, 167. For example, the material 166 may represent any appropriate metal-containing material for adjusting an appropriate work function of the gate electrode structures 160, while the material 167 may be provided in the form of a highly conductive electrode material such as aluminum, aluminum alloys and the like.

The device 100 as shown in FIG. 1b may be formed on the basis of well-established replacement gate strategies in which at least the placeholder material 162 is removed, for instance by using highly selective wet chemical etch recipes, for instance based on tetra methyl ammonium hydroxide (TMAH) or any other ammonium-based etch chemistries. In other cases, in addition to or alternatively, plasma-based etch recipes may be used. During the removal process, the material 161 (FIG. 1a) may act as an efficient etch stop material, which may have to be removed in a further etch process. Consequently, during this process sequence, the material 121 is exposed to various etch atmospheres, thereby also contributing to surface irregularities due to the inferior etch resistivity of the material 121. Furthermore, upon depositing various gate dielectric materials of the layer 165 and various work function adjusting metal layers 166, which may have to be partially removed in some of the gate electrode structures, additional exposure to reactive etch atmospheres may occur, thereby further damaging the material 121. Finally, the actual fill metal 167 is deposited by any appropriate deposition techniques and excess materials of the previous process sequence are removed, for instance on the basis of CMP and the like. Due to the damaged material 121 and the previously created recesses 121r (FIG. 1a), there is a significant probability that metal residues 167r remain on the material 121, wherein at least some of these residues 167r may cause leakage paths or even short-circuits between neighboring gate electrode structures or between contact elements still to be formed in the material 121 in a later manufacturing stage.

Consequently, although a replacement gate strategy provides a very efficient manufacturing process for providing high-k metal gate electrode structures in a late manufacturing stage, i.e., after performing any high temperature processes, significant yield losses may occur during conventional process strategies due to significant damage of the interlayer dielectric material 121 prior to and upon replacing the placeholder material with at least a metal-containing electrode material.

In view of the situation described above the present disclosure relates to manufacturing techniques and semiconductor devices in which a replacement gate approach may be applied while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which material damage in an interlayer dielectric material may be reduced upon performing a replacement gate approach. To this end, the dielectric material for laterally encapsulating the gate electrode structures may be provided on the basis of different deposition techniques so as to obtain superior gap filling behavior for a first portion of the interlayer dielectric material, thereby efficiently reducing the aspect ratio for the deposition of a further portion of the interlayer dielectric material, which provides the desired etch resistivity and mechanical strength during the further processing.

One illustrative method disclosed herein comprises forming a first dielectric material above a gate electrode structure of a transistor, wherein the gate electrode structure comprises a placeholder material and wherein the gate electrode structure extends to a first height level. The method further comprises removing a portion of the first dielectric material so as to extend to a second height level that is lower than the first height level. The method further comprises forming a second dielectric material above the first dielectric material, wherein the second dielectric material extends above the first height level. Additionally, the method comprises performing a planarization process so as to remove a portion of the second dielectric material and form an exposed top surface of the placeholder material. Moreover, the method comprises replacing the placeholder material at least with a metal-containing electrode material.

A further illustrative embodiment disclosed herein comprises forming a first interlayer dielectric material laterally adjacent to a gate electrode structure. The gate electrode structure comprises a placeholder material and a dielectric cap layer formed on the placeholder material. Furthermore, the first dielectric material is formed so as to extend to a height level that is less than a height level of an interface that is formed by the dielectric cap layer and the placeholder material. The method further comprises forming a second interlayer dielectric material above the first interlayer dielectric material. Moreover, the method comprises removing the dielectric cap layer so as to expose a top surface of the placeholder material by performing a planarization process on the second interlayer dielectric material. Additionally, the method comprises replacing the placeholder material at least with a metal-containing electrode material in the presence of a preserved portion of the second interlayer dielectric material.

One illustrative semiconductor device disclosed herein comprises a high-k metal gate electrode structure formed on a semiconductor region and having a top surface that extends to a gate height level. The semiconductor device further comprises a first interlayer dielectric material that is formed laterally adjacent to the high-k metal gate electrode structure. Additionally, the semiconductor device comprises a second interlayer dielectric material formed on the first interlayer dielectric material laterally adjacent to the high-k metal gate electrode structure, wherein the first and second interlayer dielectric material form a substantially planar interface at a height level that is below the gate height level.

BRIEF DESCRIPTION OF THE DRAWINGS

The disclosure may be understood by reference to the following description taken in conjunction with the accompanying drawings, in which like reference numerals identify like elements, and in which.

Figure 1A:
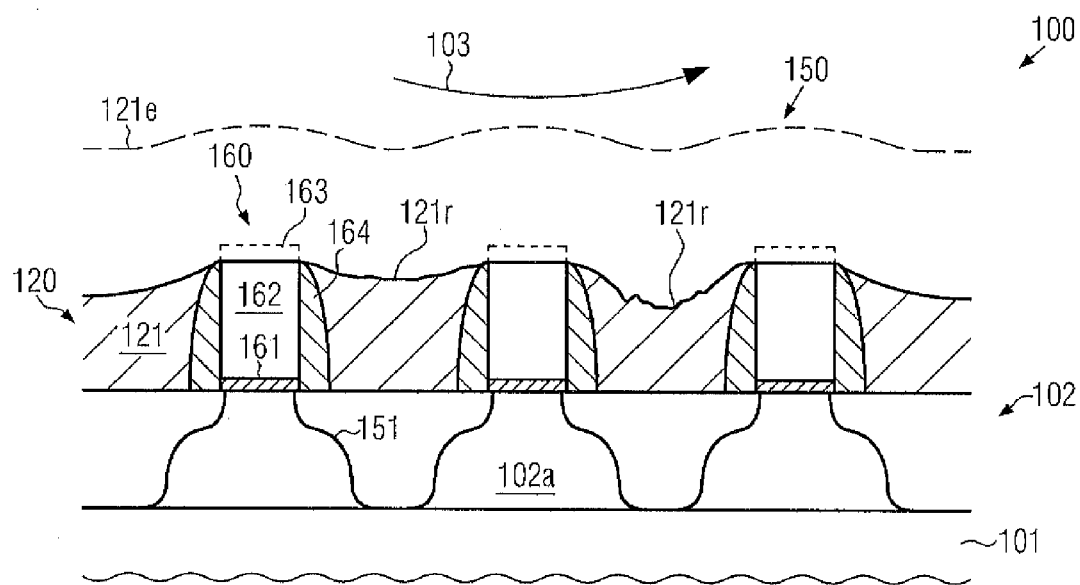
FIGS. 1a-1b schematically illustrate cross-sectional views of a semiconductor device during various manufacturing stages when applying a replacement gate approach on the basis of an interlayer dielectric material provided on the basis of a process technique having superior gap filling capabilities.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention generally provides manufacturing techniques and semiconductor devices in which the contact level of a semiconductor device may be formed on the basis of at least two different interlayer dielectric materials, which thus laterally encapsulate the gate electrode structures upon performing a replacement gate strategy. That is, a first interlayer dielectric material may be provided on the basis of any appropriate deposition technique, which ensures a substantially void-free filling of high aspect ratio openings, such as the spaces between closely spaced gate electrode structures, while a second interlayer dielectric material may provide the required superior etch resistivity and/or increased mechanical strength upon performing planarization processes, wherein, also in this case, due to the previous application of the interlayer dielectric material having the superior gap filling behavior, a reliable and substantially void-free deposition of the further interlayer dielectric material having the superior etch resistivity and mechanical strength may be accomplished. In some illustrative embodiments, well-established deposition techniques for providing silicon dioxide-like materials may be applied in order to obtain a substantially void-free filling of critical openings, while the resulting material characteristics may not negatively influence the further processing. To this end, the height level of the interlayer dielectric material having the superior gap fill behavior is adjusted such that a subsequent interlayer dielectric material of superior material characteristics may be provided with sufficient thickness so as to ensure a high etch resistivity and a reduced removal rate upon replacing the placeholder material in sophisticated replacement gate approaches. On the other hand, the height level of the underlying interlayer dielectric material having the superior gap fill behavior is sufficient so as to allow a reliable deposition process of the interlayer dielectric material of superior material characteristics.

In some illustrative embodiments, the at least two different interlayer dielectric materials may be provided on the basis of silicon and oxygen, as discussed above, while, in other cases, at least the second interlayer dielectric material may have incorporated therein an appropriate atomic species, such as nitrogen, in order to further enhance etch resistivity and/or mechanical strength. In some illustrative embodiments, the second interlayer dielectric material may be provided in the form of a silicon nitride material, which generally provides superior etch resistivity with respect to a plurality of wet chemical etch recipes, while also a reduced removal rate is typically obtained during a planarization process. For example, by incorporating a nitrogen species and thus imparting a silicon nitride-like behavior to a silicon dioxide base material or by generally providing a silicon nitride material, the characteristics of the interlayer dielectric material may be adapted to the characteristics of a dielectric cap layer, which is frequently provided in the form of a silicon nitride material, thereby providing very similar process conditions upon exposing the top surface of a placeholder material during a planarization process. Hence, the resulting surface topography may be provided with superior planarity at the same time enhanced etch resistivity may be achieved during the further processing.

In other illustrative embodiments, any other appropriate combination of interlayer dielectric materials may be provided, as long as a reliable filling of critical spaces between closely spaced gate electrode structures is ensured in combination with superior etch resistivity and/or reduced removal rate during the replacement gate approach.

Figure 1B:
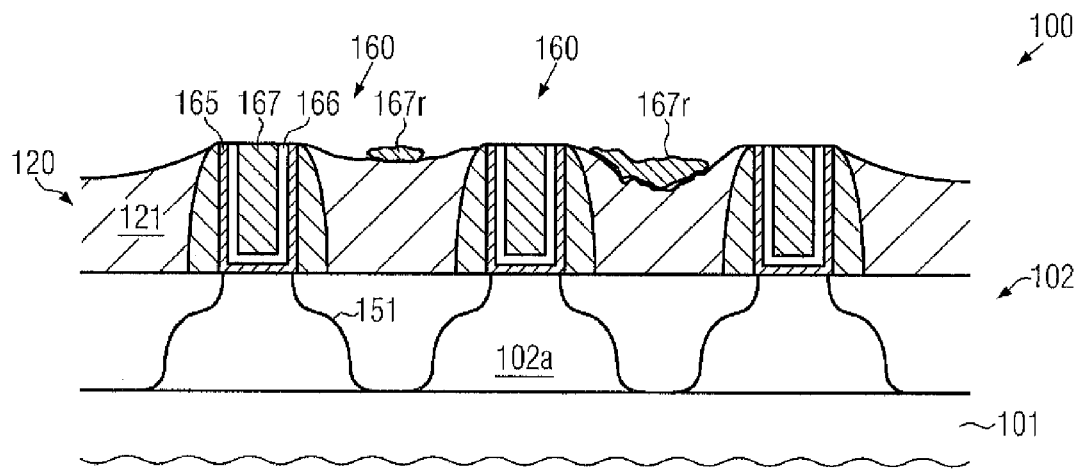

With reference to FIGS. 2a-2f, further illustrative embodiments will now be described in more detail, wherein reference may also be made to FIGS. 1a-1b, if required.

Figure 2A:
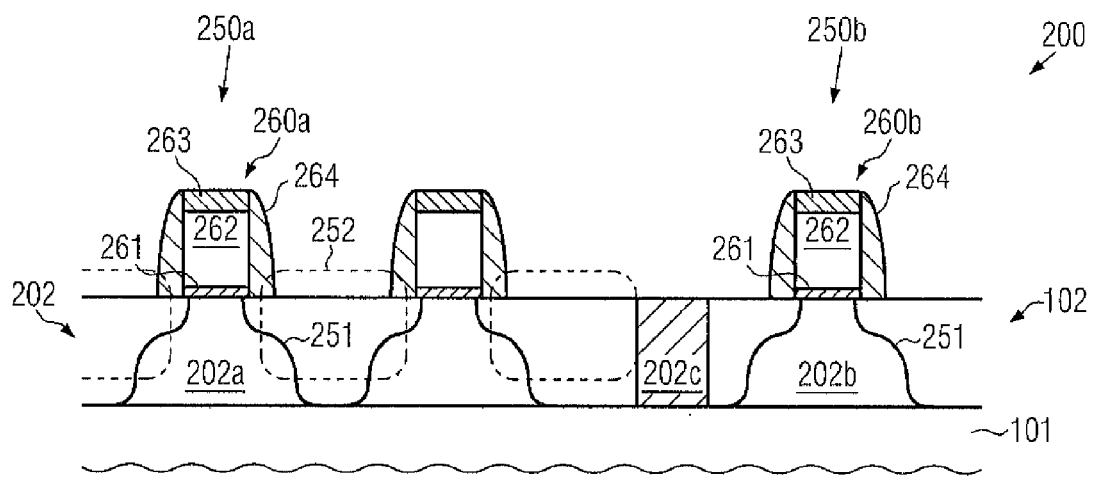
FIGS. 2a-2f schematically illustrate cross-sectional views of a semiconductor device during various manufacturing stages when applying a replacement gate approach by providing the encapsulating dielectric material on the basis of at least two different deposition techniques so as to reduce damage during the replacement gate approach, according to illustrative embodiments.

FIG. 2a schematically illustrates a cross-sectional view of a semiconductor device 200 comprising a substrate 201 and a semiconductor layer 202. The semiconductor device 200 is in an advanced manufacturing stage, i.e., transistors 250a, 250b may be formed in and above the semiconductor layer 202. For example, the semiconductor layer 202 may be divided into a plurality of active regions, wherein, for convenience, a first active region 202a and a second active region 202b are illustrated. For example, the transistors 250a may represent closely spaced transistors formed in and above the active region 202a, while the transistor 250b may represent any other circuit component which may be located adjacent to the active region 202a, for instance separated therefrom by an isolation region 202c, while in other cases the active region 202b may represent any device area of the device 200 in which generally different process conditions may be encountered, for instance due to the provision of isolated circuit components, while, in other cases, buried circuit components, such as substrate diodes, may be formed below the active region 202b, if an SOI configuration is considered. In this case, typically, the difference in surface topography above the active region 202a and the region 202b may even be more pronounced when applying conventional replacement gate approaches. For convenience, the circuit element 250b may be considered as a transistor having the same or different conductivity type compared to the transistors 250a. As shown, the transistors 250a, 250b may comprise drain and source regions 251 having any appropriate profile, wherein, in some of the transistors 250a, 250b, an additional performance enhancing mechanism may be implemented, for instance in the form of a strain-inducing semiconductor alloy, as indicated by 252. Furthermore, as also discussed above, in some embodiments, metal silicide regions (not shown) may be provided in the drain and source regions 251, depending on the overall process strategy.

Furthermore, the transistors 250a may comprise gate electrode structures 260a which in turn may comprise a dielectric material 261, a placeholder material 262, possibly in combination with a dielectric cap layer 263, and a sidewall spacer structure 264. Similarly, the transistor 250b may comprise a gate electrode structure 260b which may have basically the same structure as the gate electrode structure 260a. As discussed above with reference to the device 100, at least in some device areas, the gate electrode structures 260a may represent closely spaced gate electrode structures, thereby defining a high aspect ratio, i.e., a ratio of gate height to lateral distance of the gate electrode structures.

The semiconductor device 200 as shown in FIG. 2a may be formed on the basis of any appropriate process strategy in which the active regions 202a, 202b may be formed by providing the isolation structure 202c, which in turn may be accomplished by well-established lithography, etch, deposition and planarization techniques. Prior to or after, the basic electronic characteristics of the regions 202a, 202b may be adjusted by performing implantation processes and the like. Next, the gate electrode structures 260a, 260b may be formed on the basis of a process strategy as is also discussed above with reference to the device 100. That is, the materials 261, 262 and 263 may be deposited on the basis of any appropriate deposition technique, followed by a sophisticated lithography and etch process sequence in order to obtain the gate electrode structures 260a, 260b with the desired lateral dimensions, which may be 50 nm and significantly less, such as 30 nm and less when a length of the gate electrode structures 260a, 260b is considered. A gate length is to be understood as the horizontal extension in FIG. 2a of the placeholder material 262.

Figure 2B:
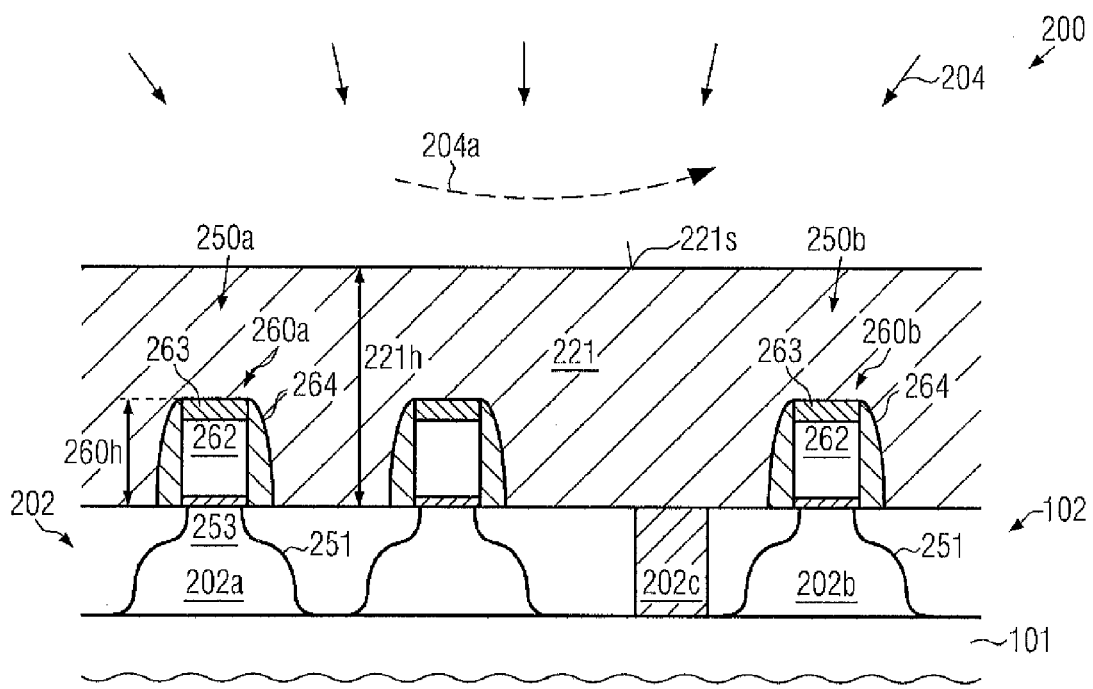

FIG. 2b schematically illustrates the semiconductor device 200 in a further advanced manufacturing stage. As illustrated, in some illustrative embodiments, a deposition process 204 may be applied so as to provide a first interlayer dielectric material 221, which is reliably deposited so as to avoid the creation of any voids so that a substantially continuous material may be formed above and between the gate electrode structures 260a and 260b. To this end, the deposition process 204 may be applied in the form of a spin coating process in which the dielectric material 221 may be provided in a low viscous state based on well-established process recipes, thereby reliably filling even the space between the closely spaced gate electrode structures 260a. For example, silicon dioxide-like materials may be applied, for instance in the form of "spin-on glass," thereby obtaining a substantially planar surface topography, as indicated by 221s, while still reliably filling critical openings of the device 200. Consequently, the material 221 may be formed above and between the gate electrode structures 260a, 260b and may thus extend with its surface 221s to a height level 221h, which is less compared to a gate height level 260h. It should be appreciated that the height levels may be referred to the active region 202a, or at least a portion thereof, such as a channel region 253.

In other illustrative embodiments, the deposition process 204 may include a chemical vapor deposition (CVD) process using well-established process recipes in which a flow-like deposition behavior is obtained. Also in this case, a void-free and reliable filling of critical openings may be achieved, while the surface 221s may be provided with superior planarity. For example, a plurality of process recipes are well established for forming a silicon dioxide-like material on the basis of appropriate precursor materials, such as TEOS (tetra ethyl ortho silicate) and the like.

It should be appreciated that any other appropriate dielectric material, such as polymer materials and the like, may also be provided as the dielectric material 221, as long as any such materials are compatible with the further processing of the device 200, since the material 221, i.e., a portion thereof, is to be considered as a permanent interlayer dielectric material and will be preserved during the further processing.

In some illustrative embodiments, an additional planarization process 204a may be applied so as to further enhance the planarity of the surface 221s. To this end, an appropriately adapted CMP process may be applied, thereby even further reducing any differences in surface topography, thereby obtaining a highly uniform height level 221h across the entire device 200. For example, as discussed above, in some device areas, a pronounced surface topography may be created, for instance upon removing a portion of the semiconductor layer 202 when forming substrate diodes in an SOI configuration 202 and the like, wherein any such pronounced height differences may be efficiently compensated for by providing the material 221 on the basis of the deposition process 204 having a superior gap filling capability, possibly in combination with the additional planarization process 204a.

Figure 2C:
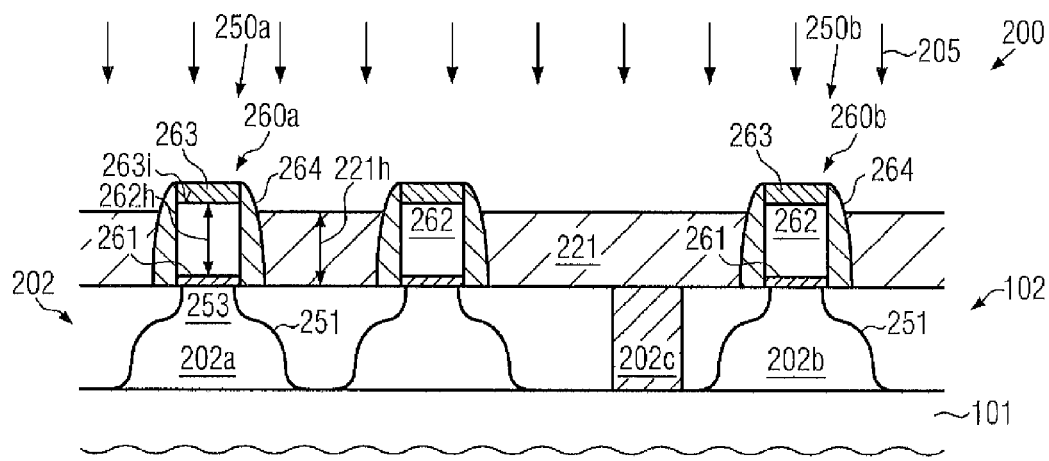

FIG. 2c schematically illustrates the semiconductor device 200 in a further advanced manufacturing stage. As illustrated, a material removal process 205 may be applied to the first interlayer dielectric material 221 so as to reduce the height level thereof with respect to the further processing of the device 200. In some illustrative embodiments, the removal process 205 may be applied in the form of a wet chemical etch process in which the material 221 may be removed selectively with respect to the gate electrode structures 260a, 260b. For example, when a silicon dioxide-like material is used for the interlayer dielectric material 221, a plurality of wet chemical etch recipes are available in which any such material may be removed highly selectively with respect to other dielectric materials, such as silicon nitride and the like. In this case, the cap layer 263 and the spacer structure 264 may preserve integrity of the gate electrode structures. In other cases, the removal process 205 may include a plasma assisted etch process for which a plurality of selective etch recipes are well-established in the art. In other cases, any other removal process, such as sputter etching, evaporation by performing a laser-based heat treatment and the like, may be applied, as long as sufficient process control is achieved in order to adjust the height level 221h in accordance with the process requirements. That is, in illustrative embodiments, the height level 221h is adjusted by the process 205 so as to be below a height level 262h, which is defined by an interface 263i formed by the dielectric cap layer or cap layer system 263 and the placeholder material 262. In this manner, the cap layer 263 may be removed in a later manufacturing stage while still ensuring that at least a certain portion of a further interlayer dielectric material still to be formed may be preserved above the first interlayer dielectric material 221.

It should be appreciated that, in some illustrative embodiments, the height level 221h of the interlayer dielectric material 221 may also be adjusted on the basis of a deposition process, such as the process 204 (FIG. 2b), as long as the aspect ratio between the closely spaced gate electrode structures 260a may be sufficiently reduced in order to allow a reliable deposition of a further interlayer dielectric material on the basis of appropriate deposition techniques. For example, during a spin coating process, process parameters may be adjusted such that a maximum height of the resulting interlayer dielectric material 221 may be below the height level 262h. In this case, although a substantially non-planar surface topography may be created, nevertheless the resulting aspect ratio between the closely spaced gate electrode structures 260a may be sufficiently small so as to allow the subsequent deposition of an interlayer dielectric material of superior material characteristics without causing deposition-related irregularities.

Figure 2D:
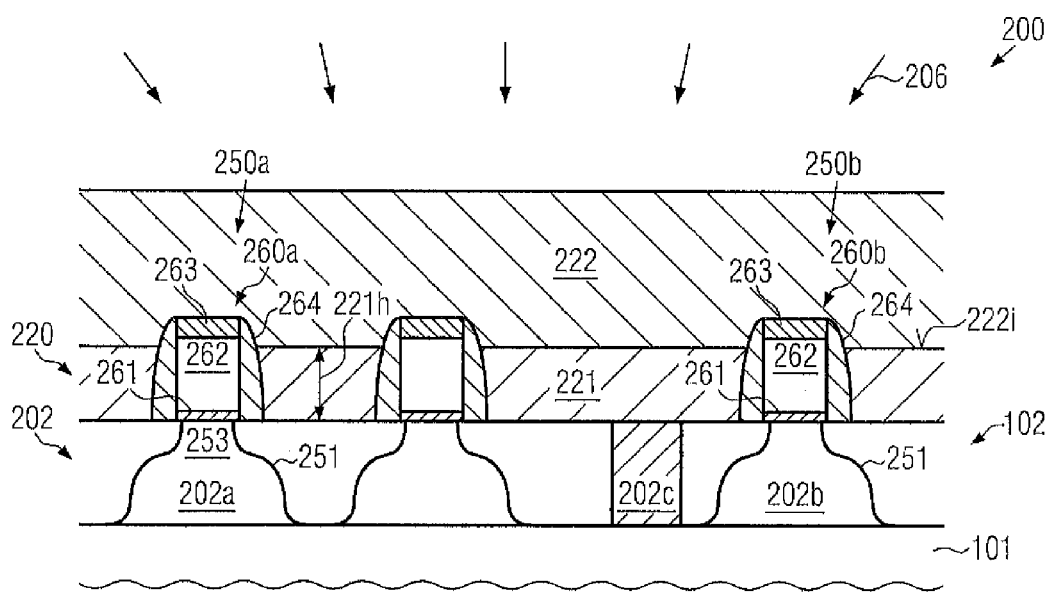

FIG. 2d schematically illustrates the device 200 in a further advanced manufacturing stage. As shown, a second interlayer dielectric material 222 of a contact level 220 may be formed above the first interlayer dielectric material 221 and may, in some illustrative embodiments, be formed directly on the material 221, thereby forming an interface therewith, as indicated by 222i. The material 222 may be provided in the form of a material having superior etch resistivity and/or mechanical strength compared to the first interlayer dielectric material 221, as is also discussed above. To this end, the material 222 may be provided as a silicon dioxide-like material in some illustrative embodiments, which may be accomplished by using appropriate CVD recipes during a deposition process 206, for instance by using high density plasma assisted CVD techniques in order to form a highly dense silicon dioxide-like material. To this end, well-established deposition recipes based on TEOS, silane and the like may be used. It should be appreciated that the formation of dense silicon dioxide material is a well-established process, which may be applied in this case since the previously provided material 221 may significantly reduce the remaining aspect ratio, thereby enabling a reliable void-free deposition of the material 222.

In other illustrative embodiments, the deposition process 206 may result in the deposition of a silicon nitride material, which may be accomplished on the basis of a plurality of plasma assisted deposition recipes, wherein, by appropriately selecting process parameters, the material characteristics of the resulting silicon nitride material may be adjusted in a wide range. Generally, providing a significant amount of nitrogen in the layer 222, even if pronounced amounts of oxygen are contained, may result in superior etch resistivity and mechanical resistance compared to the material 221 having the superior gap filling behavior. Furthermore, by providing the material 221 with a desired height level 221h, a significantly less pronounced surface topography may be obtained by depositing the material 222, which in turn may also translate into superior process conditions during the further processing of the device 200. In some illustrative embodiments, the second interlayer dielectric material 222 may be provided on the basis of a similar material composition or at least on the basis of similar material characteristics, in particular with respect to a subsequent planarization process, compared to the dielectric cap layer 263, thereby providing significantly relaxed process conditions upon exposing the placeholder material 262.

Figure 2E:
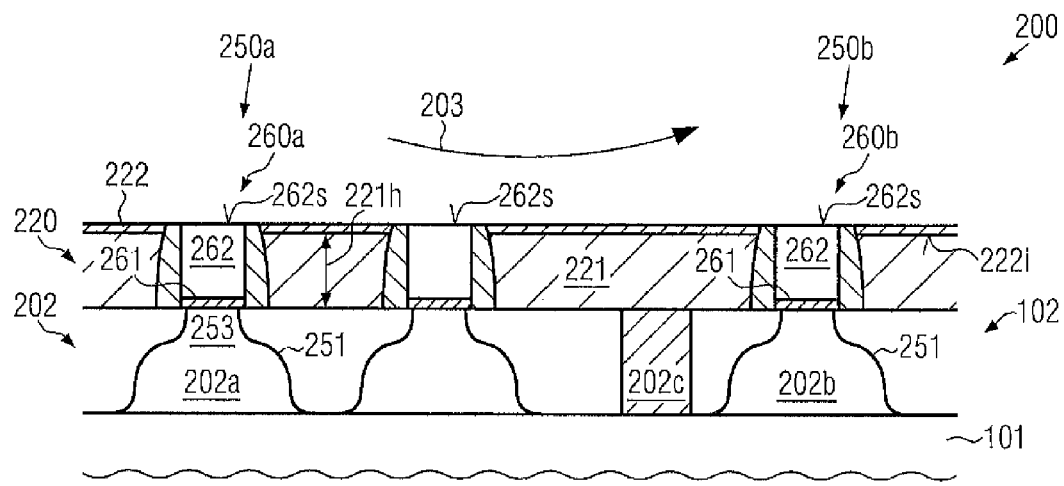

FIG. 2e schematically illustrates the semiconductor device 200 during a planarization process 203 in which a portion of the second interlayer dielectric material 222 may be removed, which may be accomplished on the basis of a CMP process, an etch process or a combination thereof. In some illustrative embodiments, the removal process 203, at least in a final phase thereof, may be performed as a CMP process in which the dielectric cap layer 263 (FIG. 2d) and the material 222 may be concurrently removed, wherein the superior material characteristics of the material 222 may provide significantly less pronounced surface irregularities compared to the conventional strategy. Moreover, the height level 221h may be selected such that, upon reliably exposing a top surface 262s of the placeholder material 262, nevertheless, a desired thickness of the material 222 may be preserved so as to provide superior process conditions during the further processing of the device 200. As discussed above, the height level 221h is typically selected so as to be below the height level 262h (FIG. 2c) in a manner that enables the reliable void-free deposition of the material 222 while at the same time providing sufficient process margins upon exposing the top surface 262s in order to preserve a portion of the material 222. Consequently, due to the presence of the second interlayer dielectric material 222 having the superior material characteristics, a superior etch resistivity may be achieved during the further processing, while also a superior surface planarity may be achieved upon performing the planarization process 203. For example, the dielectric material 222 and the cap material may have very similar removal rates, at least during the final phase of the process 203, thereby providing superior planarity of the resulting surface without requiring pronounced over-polishing time in order to reliably expose the top surface 262s.

Thereafter, the further processing may be continued by removing at least the placeholder material 262 and possibly the dielectric material 261, depending on the overall process strategy, wherein, as discussed above, typically wet chemical and/or plasma assisted etch recipes have to be applied in combination with highly efficient wet chemical cleaning processes. Due to the presence of the dielectric material 222, pronounced material removal may be suppressed in the dielectric materials 222, 221, the further processing, i.e., the deposition of at least metal-containing electrode materials, possibly in combination with any high-k dielectric material, may be accomplished on the basis of superior process conditions, for instance in terms of superior surface smoothness and the like, while the removal of any excess material thereof may also be accomplished with a significantly reduced probability of creating device failures due to any metal residues.

Figure 2F:
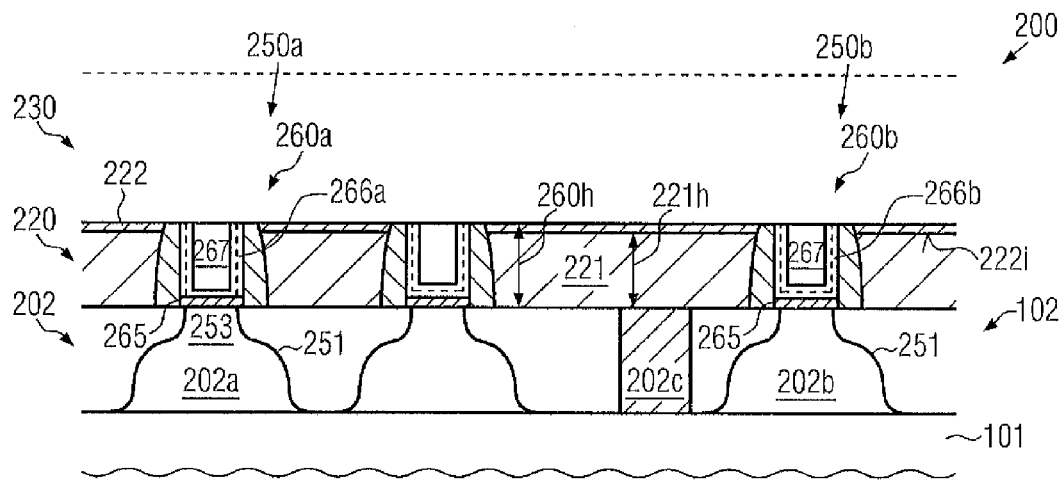

FIG. 2f schematically illustrates the semiconductor device 200 in an advanced manufacturing stage. As shown, the gate electrode structures 260a, 260b may now be provided in the form of high-k metal gate electrode structures comprising a gate dielectric material 265 including a high-k dielectric layer in combination with at least one metal-containing electrode material for adjusting the work function of the gate electrode structures 260a, 260b. As explained above, the gate electrode structures 260a may comprise a different type of work function adjusting metal species, as indicated by 266a, compared to the gate electrode structure 260b, as indicated by the metal layer 266b, if these gate electrode structures 260a, 260b are part of different types of transistors. Furthermore, a highly conductive fill metal 267 may be provided. As discussed above, these material layers may be formed on the basis of well-established deposition techniques, followed by the removal of any excess material, for instance using CMP, etch techniques and the like. Due to the presence of the second interlayer dielectric material 222, the superior surface configuration may be substantially preserved during the formation of the high-k metal gate electrode structures 260a, 260b. In some illustrative embodiments, the thickness of the second interlayer dielectric material 222 may be selected such that, even after any removal processes for removing any excess material, the final resulting gate height 260h may be above the height level 221h of the interlayer dielectric material 221. In this case, at least a portion of the material 222 may be preserved during the further processing, for instance upon forming the metallization system 230 above the contact level 220. In this case, a dielectric material of the metallization system 230 may be formed above and in some illustrative embodiments on the dielectric material 222.

As a result, the present disclosure provides manufacturing techniques and semiconductor devices in which a replacement gate approach may be performed on the basis of superior process conditions by providing the encapsulating dielectric material in the form of at least a first interlayer dielectric material and a second interlayer dielectric material. The first interlayer dielectric material may reduce the aspect ratio by reliably filling sophisticated openings, such as spaces between closely spaced gate electrode structures, while the second interlayer dielectric material may also be provided without deposition-related irregularities and may provide the required material characteristics, for instance with respect to enhanced etch resistivity and reduced removal rate so as to avoid, or at least significantly reduce, damage during the replacement gate approach. Consequently, compared to conventional strategies, significantly reduced yield loss may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a first dielectric material above a gate electrode structure of a transistor, wherein forming said first dielectric material comprises applying a deposition technique so as to substantially avoid creation of voids therein, said gate electrode structure comprising a placeholder material, said gate electrode structure extending to a first height level, wherein a height level of an entire exposed upper surface of said first dielectric material extends to at least a second height level that is higher than said first height level;

performing a first planarization process so as to provide said first dielectric material with a substantially planar surface;

after performing said first planarization process, removing an upper portion of said first dielectric material so as to reduce said height level of said entire exposed upper surface from said second height level to a third height level that is lower than said first height level;

forming a second dielectric material above said first dielectric material, a height level of an entire exposed upper surface of said second dielectric material extending above said first height level;

performing a second planarization process so as to remove an upper portion of said second dielectric material and form an exposed top surface of said placeholder material; and replacing said placeholder material at least with a metal-containing electrode material.

2. A method, comprising:

forming a first dielectric material above a gate electrode structure of a transistor, said gate electrode structure comprising a placeholder material, said gate electrode structure extending to a first height level;

performing a first planarization process so as to provide said first dielectric material with a substantially planar surface;

removing a portion of said planarized first dielectric material so as to extend to a second height level that is lower than said first height level;

forming a second dielectric material above said first dielectric material, said second dielectric material extending above said first height level;

performing a second planarization process so as to remove a portion of said second dielectric material and form an exposed top surface of said placeholder material; and replacing said placeholder material at least with a metal-containing electrode material.

3. The method of claim 2, further comprising preserving at least a part of said second dielectric material when forming a metallization system above said transistor.

4. The method of claim 2, wherein said gate electrode comprises a dielectric cap layer formed above said placeholder material and wherein said cap layer is removed by performing said planarization process.

5. The method of claim 2, wherein removing said upper portion of said first dielectric material comprises performing an etch process that is selective with respect to said gate electrode structure.

6. The method of claim 2, wherein forming said first dielectric material comprises applying a deposition technique so as to substantially avoid creation of voids in said first dielectric material.

7. The method of claim 6, wherein said deposition technique comprises at least one of a spin coating process and a flow-like chemical vapor deposition process.

8. The method of claim 2, wherein forming said second dielectric material comprises forming said second dielectric material so as to have at least one of an increased etch resistivity and an increased polishing resistivity compared to said first dielectric material.

9. The method of claim 8, wherein said second dielectric material is formed so as to have a higher nitrogen concentration than a nitrogen concentration of said first dielectric material.

* * * * *